US008977974B2

(12) United States Patent
Kraut

(10) Patent No.: US 8,977,974 B2
(45) Date of Patent: Mar. 10, 2015

(54) AMBIENT NOISE BASED AUGMENTATION OF MEDIA PLAYBACK

(75) Inventor: Joel Kraut, San Francisco, CA (US)

(73) Assignee: Apple Inc., Cupertino, CA (US)

( * ) Notice: Subject to any disclaimer, the term of this patent is extended or adjusted under 35 U.S.C. 154(b) by 1069 days.

(21) Appl. No.: 12/330,335

(22) Filed: Dec. 8, 2008

(65) Prior Publication Data

US 2010/0146445 A1 Jun. 10, 2010

(51) Int. Cl.
*G06F 3/0481* (2013.01)
*H02J 7/00* (2006.01)
*H03G 3/20* (2006.01)
*H04N 5/60* (2006.01)
*H04N 21/41* (2011.01)
*H04N 21/414* (2011.01)
*H04N 21/422* (2011.01)
*H04N 21/439* (2011.01)
*H04N 21/488* (2011.01)

(52) U.S. Cl.
CPC ............. *H04N 5/60* (2013.01); *H04N 21/4126* (2013.01); *H04N 21/41407* (2013.01); *H04N 21/42202* (2013.01); *H04N 21/42203* (2013.01); *H04N 21/42224* (2013.01); *H04N 21/439* (2013.01); *H04N 21/4394* (2013.01); *H04N 21/4396* (2013.01); *H04N 21/4884* (2013.01)
USPC ............................... 715/768; 320/129; 381/57

(58) Field of Classification Search
USPC ............................... 715/768; 320/129; 381/57
See application file for complete search history.

(56) References Cited

U.S. PATENT DOCUMENTS

| 4,178,548 | A | * | 12/1979 | Thompson ...................... 455/78 |
| 4,247,955 | A | * | 1/1981 | Wiedemann ............... 455/245.2 |
| 4,864,246 | A | * | 9/1989 | Kato et al. .................... 330/129 |
| 5,552,806 | A | * | 9/1996 | Lenchik ........................ 345/156 |
| 6,323,846 | B1 | | 11/2001 | Westerman et al. |
| 6,570,557 | B1 | | 5/2003 | Westerman et al. |
| 6,677,932 | B1 | | 1/2004 | Westerman |
| 6,868,162 | B1 | * | 3/2005 | Jubien et al. .................. 381/107 |
| 6,888,536 | B2 | | 5/2005 | Westerman et al. |
| 7,136,458 | B1 | * | 11/2006 | Zellner et al. .............. 379/88.02 |
| 7,681,194 | B2 | * | 3/2010 | Van Ee et al. ................ 718/100 |
| 2002/0072982 | A1 | * | 6/2002 | Barton et al. .................... 705/26 |
| 2006/0114757 | A1 | * | 6/2006 | Theimer et al. ............ 369/30.01 |
| 2006/0190450 | A1 | * | 8/2006 | Holm et al. ....................... 707/6 |
| 2009/0138507 | A1 | * | 5/2009 | Burckart et al. ........... 707/104.1 |
| 2010/0158275 | A1 | * | 6/2010 | Zhang et al. .................. 381/107 |

OTHER PUBLICATIONS

PSP PlayStation Portable: Instruction Manual, 2005, p. 48-49, available online at http://www.playstation.com/manual/pdf/PSP-1001K-2_1.pdf.*

* cited by examiner

*Primary Examiner* — Matthew Ell
(74) *Attorney, Agent, or Firm* — Kenyon & Kenyon LLP

(57) ABSTRACT

Ambient noise sampled by a mobile device from a local environment is used to automatically trigger actions associated with content currently playing on the mobile device. In some implementations, subtitles or closed captions associated with the currently playing content are automatically invoked and displayed on a user interface based on a level of ambient noise. In some implementations, audio associated with the currently playing content is adjusted or muted. Actions can be automatically triggered based on a comparison of the sampled ambient noise, or an audio fingerprint of the sampled ambient noise, with reference data, such as a reference volume level or a reference audio fingerprint. In some implementations, a reference volume level can be learned on the mobile device based on ambient noise samples.

26 Claims, 5 Drawing Sheets

AMBIENT NOISE BASED AUGMENTATION OF MEDIA PLAYBACK

TECHNICAL FIELD

This subject matter is related generally to user interfaces.

BACKGROUND

A video can include subtitles or closed captions. The subtitles or closed captions can provide a translation or a transcript of the spoken dialogue in a video and optionally other information. Closed captions are useful to hearing impaired viewers. Subtitles are useful for viewing foreign language videos or for viewing videos in a noisy environment. Subtitles and closed captions are typically invoked on a mobile device by selecting an option from a menu screen. On some devices, navigating menus and selecting audio options can be a cumbersome process that requires the user to perform multiple actions or steps.

SUMMARY

Ambient noise sampled by a mobile device from a local environment is used to automatically trigger actions associated with content currently playing on the mobile device. In some implementations, subtitles or closed captions associated with the currently playing content are automatically invoked and displayed on a user interface based on a level of ambient noise. In some implementations, audio associated with the currently playing content is adjusted or muted. Actions can be automatically triggered based on a comparison of the sampled ambient noise, or an audio fingerprint of the sampled ambient noise, with reference data, such as a reference volume level or a reference audio fingerprint. In some implementations, a reference volume level can be learned on the mobile device based on ambient noise samples.

DETAILED DESCRIPTION

Example Mobile Device

Figure 1:
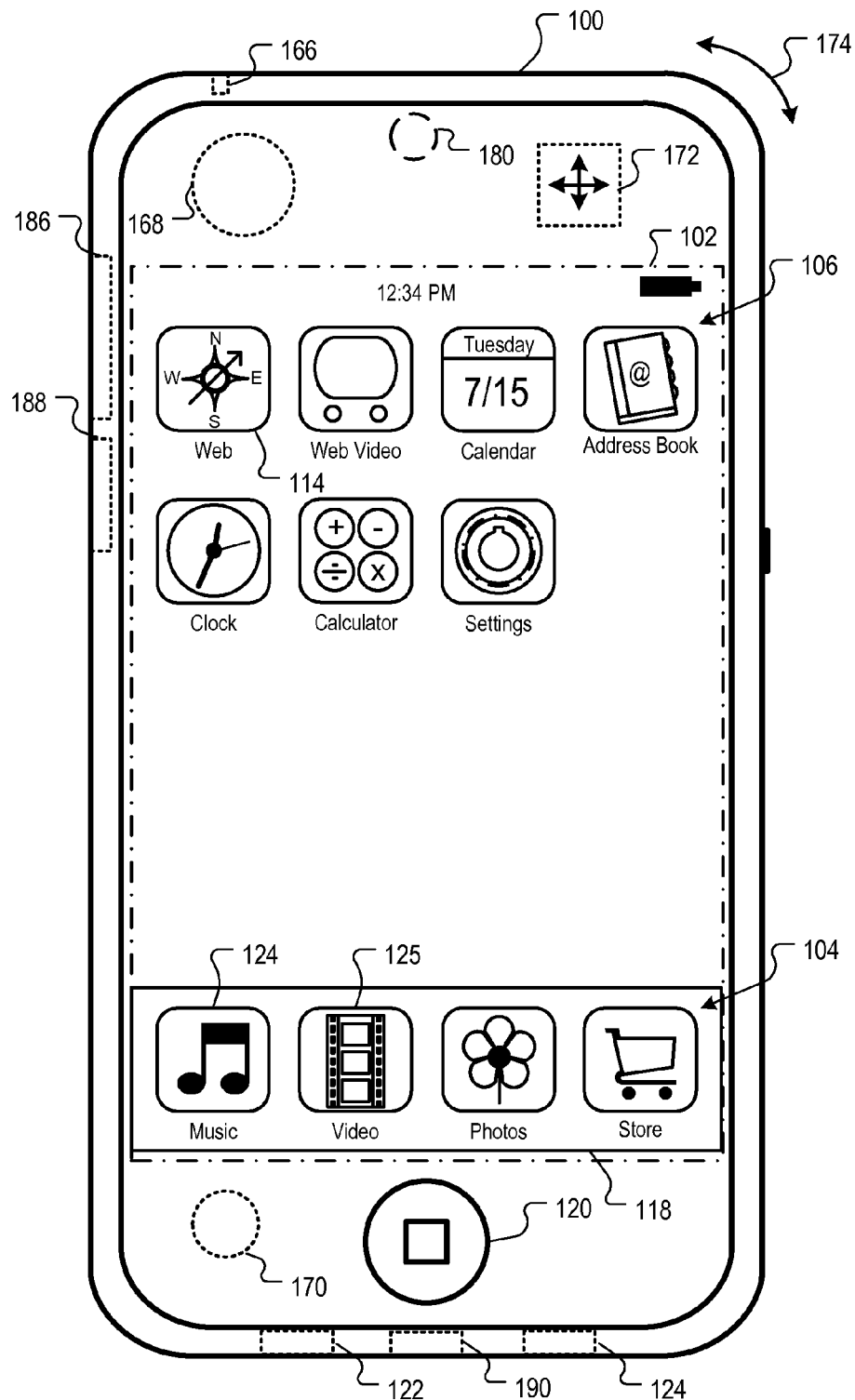
FIG. 1 is a block diagram of an example mobile device.

FIG. 1 is a block diagram of an example mobile device 100. The mobile device 100 can be, for example, a handheld computer, a personal digital assistant, a cellular telephone, a network appliance, a camera, a smart phone, an enhanced general packet radio service (EGPRS) mobile phone, a network base station, a media player, a navigation device, an email device, a game console, or a combination of any two or more of these data processing devices or other data processing devices.

In some implementations, the mobile device 100 includes a touch-sensitive display 102. The touch-sensitive display 102 can implement liquid crystal display (LCD) technology, light emitting polymer display (LPD) technology, or some other display technology. The touch-sensitive display 102 can be sensitive to haptic and/or tactile contact with a user.

In some implementations, the touch-sensitive display 102 can comprise a multi-touch-sensitive display 102. A multi-touch-sensitive display 102 can, for example, process multiple simultaneous touch points, including processing data related to the pressure, degree, and/or position of each touch point. Such processing facilitates gestures and interactions with multiple fingers, chording, and other interactions. Other touch-sensitive display technologies can also be used, e.g., a display in which contact is made using a stylus or other pointing device. Some examples of multi-touch-sensitive display technology are described in U.S. Pat. Nos. 6,323,846, 6,570,557, 6,677,932, and 6,888,536.

In some implementations, the mobile device 100 can display one or more graphical user interfaces on the touch-sensitive display 102 for providing the user access to various system objects and for conveying information to the user. In the example shown, display objects 106 are graphic representations of system objects. Some examples of system objects include device functions, applications, windows, files, alerts, events, etc.

Example Mobile Device Functionality

In some implementations, the mobile device 100 can perform multiple applications, including but not limited to: telephony, e-mail, data communications and media processing. In some implementations, display objects 106 can be presented in a menu bar or "dock" 118. In the example shown, the dock 118 includes music and video display objects 124, 125. In some implementations, system objects can be accessed from a top-level graphical user interface or "home" screen by touching a corresponding display object 104, 106. A mechanical button 120 can be used to return the user to the "home" screen.

In some implementations, upon invocation of an application, the touch screen 102 changes, or is augmented or replaced, with another user interface or user interface elements, to facilitate user access to particular functions associated with a selected application. For example, in response to a user touching the Web object 114 the graphical user interface can present user interface elements related to Web-surfing.

In some implementations, the mobile device 100 can include one or more input/output (I/O) devices and/or sensors. For example, a speaker 122 and a microphone 124 can be included to facilitate voice-enabled functionalities, such as phone and voice mail functions. The microphone 124 can be used to receive ambient noise, as described in reference to FIG. 4.

In some implementations, an up/down button for volume control of the speaker and the microphone can be included. The mobile device 100 can also include an on/off button for a ring indicator of incoming phone calls. In some implementations, a loud speaker can be included to facilitate hands-free voice functionalities, such as speaker phone functions. An audio jack 166 can also be included for use of headphones and/or a microphone.

In some implementations, a proximity sensor 168 can be included to facilitate the detection of the user positioning the mobile device 100 proximate to the user's ear and, in response, to disengage the touch-sensitive display 102 to prevent accidental function invocations. In some implementations, the touch-sensitive display 102 can be turned off to conserve additional power when the mobile device 100 is proximate to the user's ear.

Other sensors can also be used. For example, in some implementations, an ambient light sensor 170 can be utilized to facilitate adjusting the brightness of the touch-sensitive display 102. In some implementations, an accelerometer 172 can be utilized to detect movement of the mobile device 100, as indicated by the directional arrow 174. Display objects and/or media can be presented according to a detected orientation, e.g., portrait or landscape. In some implementations, the mobile device 100 may include circuitry and sensors for supporting a location determining capability, such as that provided by the global positioning system (GPS) or other positioning systems (e.g., systems using Wi-Fi access points, television signals, cellular grids, Uniform Resource Locators (URLs)). In some implementations, a positioning system (e.g., a GPS receiver) can be integrated into the mobile device 100 or provided as a separate device that can be coupled to the mobile device 100 through an interface (e.g., port device 190) to provide access to location-based services.

In some implementations, a port device 190, e.g., a Universal Serial Bus (USB) port, or a docking port, or some other wired port connection, can be included. The port device 190 can, for example, be utilized to establish a wired connection to other computing devices, such as other mobile devices, network access devices, a personal computer, a printer, a display screen, or other processing devices capable of receiving and/or transmitting data. In some implementations, the port device 190 allows the mobile device 100 to synchronize with a host device using one or more protocols, such as, for example, the TCP/IP, HTTP, UDP and any other known protocol.

The mobile device 100 can also include a camera lens and sensor 180. In some implementations, the camera lens and sensor 180 can be located on the back surface of the mobile device 100. The camera can capture still images and/or video.

The mobile device 100 can also include one or more wireless communication subsystems, such as an 802.11b/g communication device 186, and/or a Bluetooth™ communication device 188. Other communication protocols can also be supported, including other 802.x communication protocols (e.g., WiMax, Wi-Fi, 3G), code division multiple access (CDMA), global system for mobile communications (GSM), Enhanced Data GSM Environment (EDGE), etc.

Example Navigation Panel Overlay

Figure 2:
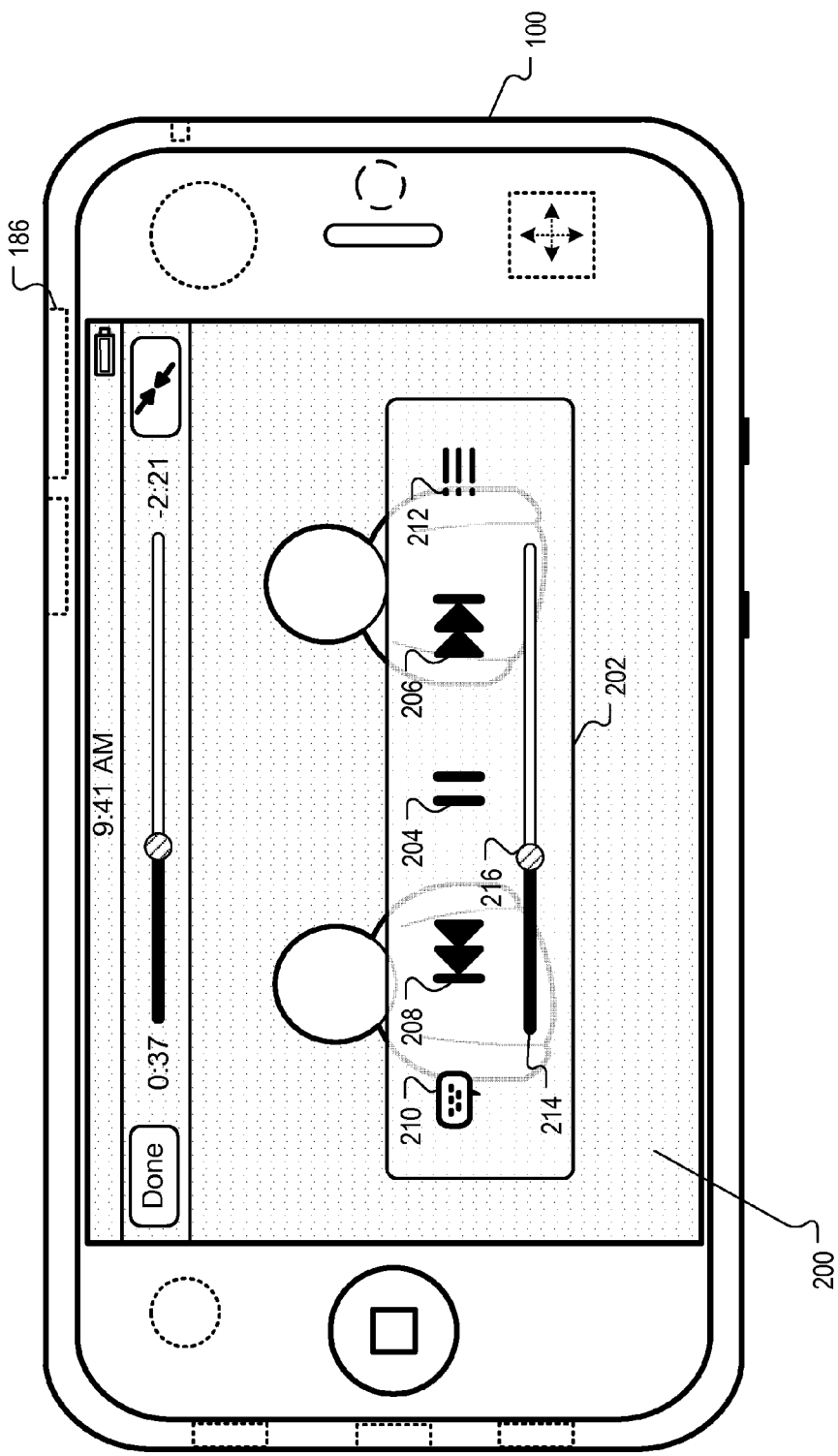
FIG. 2 illustrates an example of content playing in full screen mode on a display of the mobile device of FIG. 1, including an overlying partially transparent navigation panel.

FIG. 2 illustrates an example of content playing in full screen mode on a display 200 of the mobile device 100 of FIG. 1, including an overlying and partially transparent navigation panel 202 or "heads up" display. The navigation panel 202 can contain one or more navigation elements which can be used to invoke navigation operations on the currently playing content (e.g., video, audio, slideshow, keynote presentation, television broadcast, webcast, videocast). In some implementations, the navigation panel 202 can be at least partially transparent such that the underlying content (e.g., currently playing video content) can be seen.

In the example shown, the user is viewing video content and the navigation panel 202 includes a navigation element 204 for playing or pausing the video, a navigation element 206 for forwarding the video and a navigation element 208 for reversing the video. The user can turn closed captioning on or off by touching a closed captioning element 210. The user can specify a language preference by touching a language menu element 212 to invoke a language option sheet 300, as described in reference to FIG. 3. The navigation panel 202 may also contain a scrubber 214 with a handle 216 which can be used to navigate the video.

The video content can be stored on the mobile device 100 or streamed to the mobile device from a media service 640, as described in reference to FIG. 6. In some implementations, the video content can be a television broadcast, videocast, webcast, Internet broadcast, etc. In some implementations, the language option sheet 300 described in reference to FIG. 3 can be generated by a service (e.g., by a cable headend) or a set-top box.

Example Language Option Sheet

Figure 3:
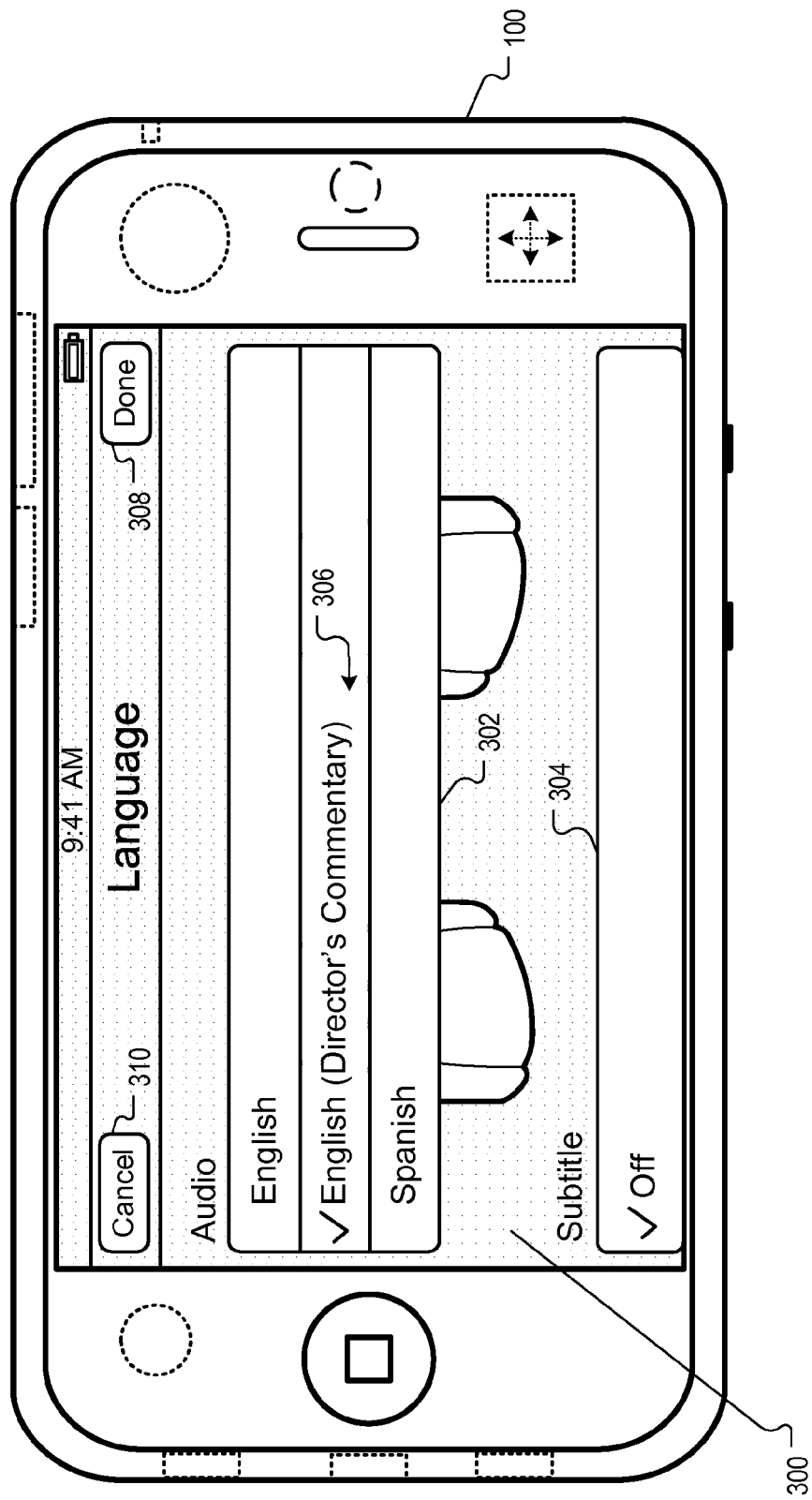
FIG. 3 illustrates an example of video content played in full screen mode, including an overlying and partially transparent option sheet.

FIG. 3 illustrates an example of a video played in full screen mode, including an overlying and partially transparent option sheet 300. The option sheet 300 includes a display element 302 showing language options for audio associated with the currently playing video. In the example shown, the language options include English, English (Director's Commentary), and Spanish. Other languages can also be included as options (e.g., French, German).

The option sheet 300 also includes a display element 304 showing options for subtitles associated with the currently playing video. Options for subtitles can include options for color, fonts and styles for the subtitles in addition to language. For example, the user can select an option to show the subtitles in a frame surround the video (e.g., letterbox mode) or overlying the video (e.g., full screen mode). In some implementations, other display elements presenting additional options may not fit on the screen. In such implementations, the viewer can scroll the sheet 300 using touch gestures so that the hidden display elements can be viewed and accessed by the viewer. The scrolling can be up or down or from side to side. In some implementations, the scrolling speed can be adjusted based on viewer input (e.g., touch input). For example, if the viewer gestures more quickly or more slowly the scrolling speed will increase or decrease, respectively.

In some implementations, a visual indicator (e.g., a check symbol) adjacent to option 306 (e.g., a text or image item) within display element 302 can indicate the viewer's currently selected audio option. In the example shown, the viewer selected English (Director's Commentary), as indicated by the check symbol adjacent the option 306. A user may select a different language by touching the corresponding option in the display element 302. Upon selecting a different option, the audio associated with the video will be played in the different selected language.

In some implementations, the selected language or option is applied globally on the mobile device 100 as a default language or option for other applications running on the mobile device 100. For example, if the user chooses to play a different video, a language selection may persist from the previously played video.

When a viewer is finished choosing language options, the viewer may select the "Done" button 308 to remove the sheet 300 from the touch screen and to retain their selected options. If a viewer does not wish to retain their selected options, or wishes to exit the sheet 300 without selecting an option, the viewer can select the "Cancel" button 310. In some other implementations, the functionality of the "Done" element 308 and the "Cancel" button 310 may be replicated by a tap sequence or gesture using one or more fingers, or by some other method(s), user interface element and/or input device.

Example Process for Ambient Noise Based Augmentation of Content

Figure 4:
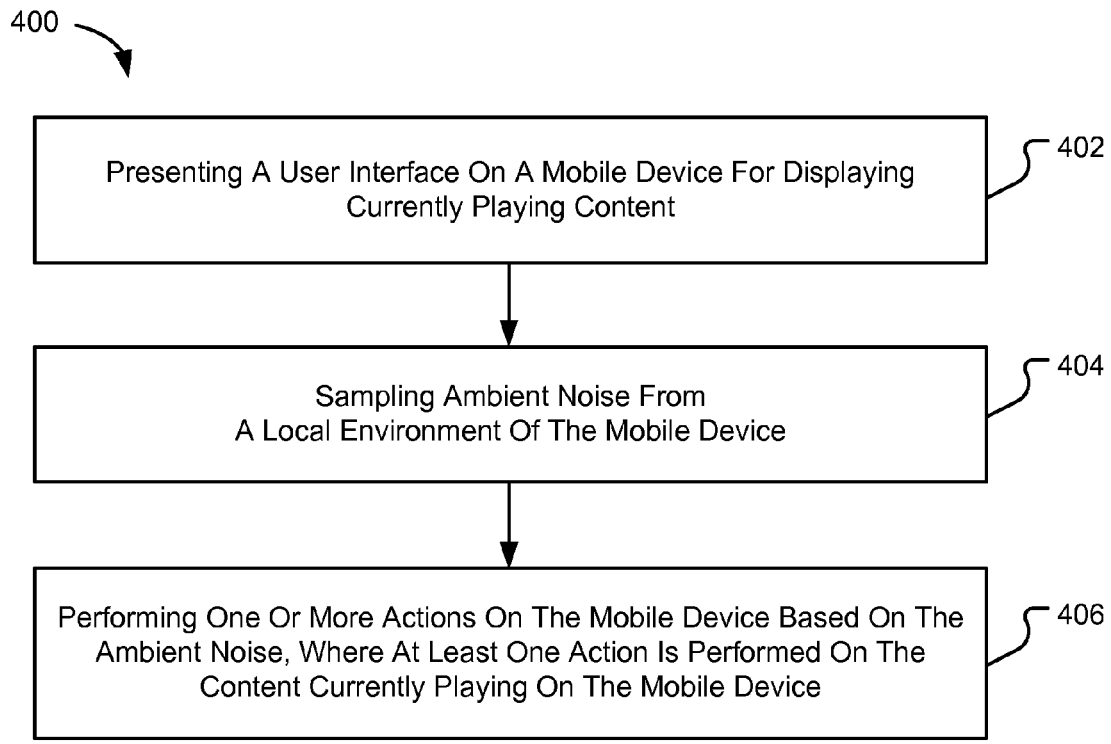
FIG. 4 is a flow diagram of an example process for ambient noise based augmentation of content.

FIG. 4 is a flow diagram of an example process 400 for ambient noise based augmentation of content. The process 400 can be performed by one or more processors or processing cores executing instructions stored in a computer program product, such as mobile device 100 executing media processing instructions.

The process 400 begins by presenting a user interface on a mobile device for displaying currently playing content (402). For example, the user interface can be presented on the touch screen 102 of mobile device 100. The user interface can be provided by the mobile device or by another device (e.g., a media service). The user interface can be presented in response to user actions on the device, including in response to touch input (e.g., one or more taps or gestures).

Ambient noise present in the local environment of the mobile device is sampled by the mobile device (404). In some implementations, the ambient noise is received through a microphone 124 of the mobile device 100. One or more actions are performed on the mobile device based on the sampled ambient noise (406). At least one action can be performed on, or associated with, the content currently playing on the mobile device.

In some implementations, a volume level of the ambient noise is measured or otherwise determined from the sampled ambient noise and compared against reference data. The reference data can be a threshold volume level. For example, if the volume level of the ambient noise exceeds a threshold volume level, then one or more actions can be performed on the currently playing content. The ambient noise volume level and threshold volume level can be represented in any convenient unit of measurement (e.g., decibels). Prior to comparing, the volume level can be filtered (e.g., a low pass filter) to remove spurious noise spikes that could trigger an unwanted action. In some implementations, the samples collected overtime and averaged or otherwise statistically processed prior to the comparing step. In some implementations, a threshold volume level can be adjusted based on samples of ambient noise data using a learning model, such as a Support Vector Machine (SVM). Thus the threshold volume level can be dynamically adjusted overtime.

In some implementations, an audio fingerprint or other audio descriptor of the ambient noise is computed. An ambient audio signal received from a microphone can be segmented into frames. For every frame a set of features can be computed. Some example features include but are not limited to: Fourier coefficients, Mel Frequency Cepstral Coefficients (MFFC), spectral flatness, sharpness, Linear Predictive Coding (LPC) coefficients. Also, derived quantities such as derivatives, means and variances of audio features can be used. The extracted features can be mapped into a compact representation by using a classification algorithm (e.g., Hidden Markov Model, quantization). Audio fingerprints of ambient noise for various environments can be stored in the mobile device or on a network accessible by the mobile device. Different actions can be taken for different environments. Thus, the mobile device can identify its local environment by sampling ambient noise present in the local environment, computing an audio fingerprint from the sampled audio noise, comparing the audio fingerprint with reference audio fingerprints stored in a database to find a match, and thus identify a type of ambient noise or environment. A table of actions can be associated with the reference audio fingerprints. The table of actions can be accessed by a processor on the mobile device which then carries out the actions. For example, there can be a different volume adjustment factor associated with each reference audio fingerprint. One environment may be more noisy than another environment. These differences in ambient noise would be captured by two different audio fingerprints. In a first environment (e.g., a gym), the ambient noise could be very loud and would require a large increase in volume or an invocation of subtitles. In a second environment (e.g., a shopping mall), the ambient noise could be less than the first environment and would require a lesser increase in volume and possible not an invocation of subtitles.

Various types of actions can be performed on, or in conjunction with, the content currently playing on the mobile device. For example, a partially transparent sheet can be overlaid on the user interface including one or more options associated with the currently playing content. Some example options can include controls for allowing the user to manually invoke subtitles or closed captioning and/or mute or adjust the audio of the currently playing content (e.g., using a volume slider control). In some implementations, one or more controls can be operable through touch or multi-touch gesturing applied to the user interface.

In some implementations, one or more actions can include the automatic invocation and/or display of subtitles and/or closed captions with the currently playing content. These automatic actions could be accompanied by other automatic actions, such as an automatic mute and/or automatic adjustment of volume (up or down) of the currently playing content. In one example, an action can be pausing the currently playing content rather than muting or adjusting the audio volume.

For mobile devices that include one or more sensors or controls (e.g., GPS, ambient light sensors, accelerometers), one or more actions can be triggered based on the ambient noise and/or input from at least one control or sensor. For example, a positioning system on the mobile device (e.g., GPS) can provide position coordinates for the mobile device. One or more actions triggered by ambient noise received by a microphone can be recorded in a database, together with a descriptor for the action. So when a user is in a gym, and subtitles are invoked due to the loud ambient noise in the gym, the location of the mobile device is recorded. Each time the user returns to the recorded location, the gym in this example, the action is automatically performed. In some implementations, only a first action in a sequence of actions is invoked based on ambient noise. For example, ambient noise can trigger a mute function, and the triggering of the mute function can trigger invocation of subtitles or closed captioning.

If the mobile device includes telephony functionality, a light sensor and/or accelerometer of the mobile device can determine when the user is on a call (a speaker is pressed to the user's ear). Additionally, the ambient noise level can be determined using a microphone. Speaker volume during the call can be increased or decreased based on the level of the ambient noise that is detected using the microphone. This would result in the speaker volume being automatically adjusted based on the ambient noise of the local environment. In some implementations, an audio input jack could determine if the user is using a headphone, so that the volume could be adjusted differently (e.g., the volume is increased or decreased less when headphones are being used). Detecting headphone connections is well-known in the art. For example, some mono earphone jacks have polarized terminals, which create a voltage difference that a detection circuit can use to detect a connection state of a mono earphone. Stereo earphone connections can be detected by slightly more complex circuitry (e.g., using a comparator which compares signals generated by connection states).

In some implementations, the frequency content of the ambient noise signal can be analyzed to determine if any particular frequency or frequency range exceeds a threshold energy level. In this example, an action may include rebalancing the frequency content of the audio signal (e.g., soundtrack of a video) so that it can be heard more clearly within the ambient noise of the local environment. In some implementations, the ambient noise detected by the microphone can be used in a noise cancellation algorithm to remove the ambient noise. This feature would allow noise cancellation technology found in some high-end headphones to be moved to the mobile device which may provide higher fidelity audio with ear bud style headphones.

Example Mobile Device Architecture

Figure 5:
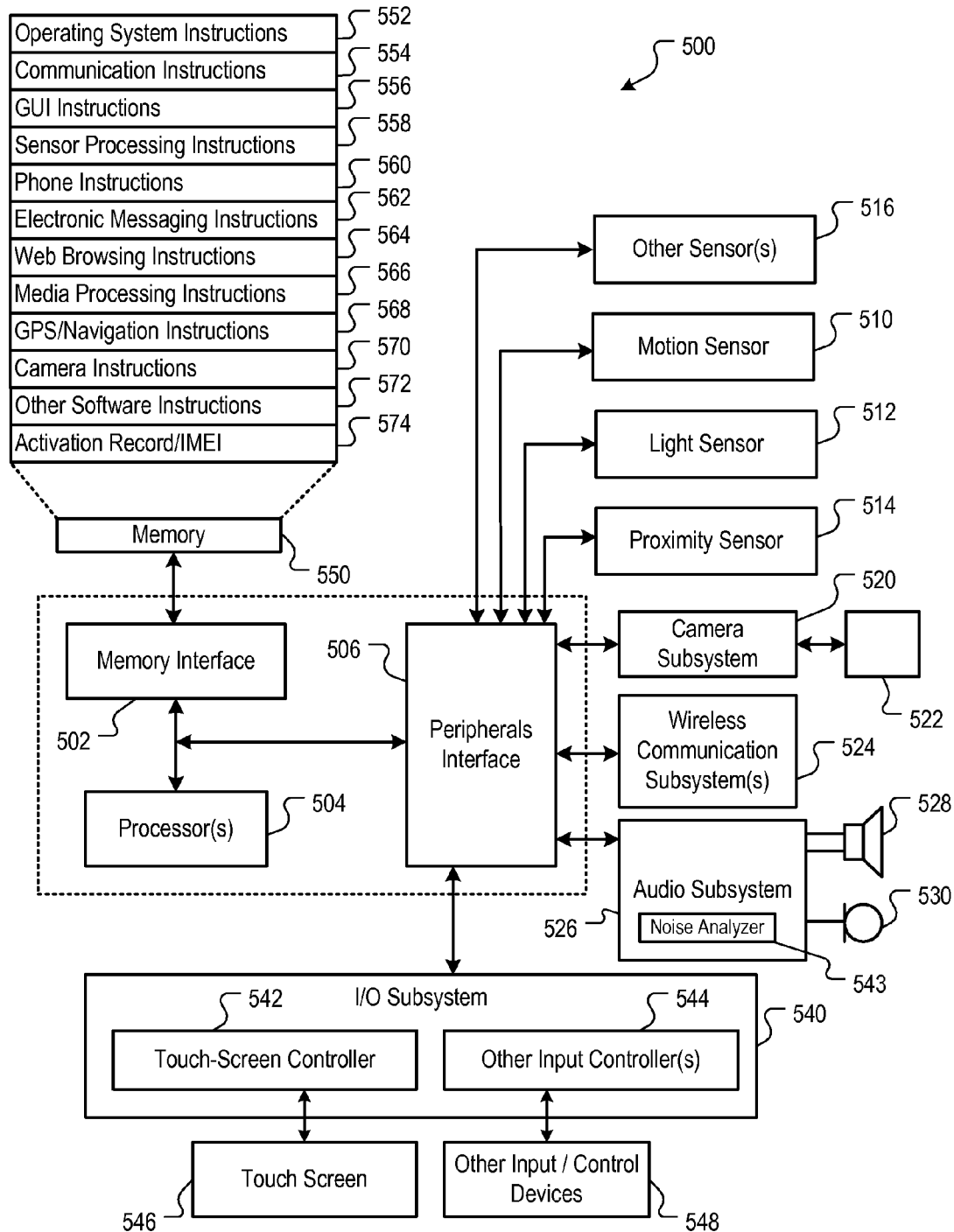
FIG. 5 is a block diagram of an example architecture of the mobile device of FIG. 1.

FIG. 5 is a block diagram of an example architecture 500 of the mobile device 100 of FIG. 1. The mobile device 100 can include a memory interface 502, one or more data processors, image processors and/or central processing units 504, and a peripherals interface 506. The memory interface 502, the one or more processors 504 and/or the peripherals interface 506 can be separate components or can be integrated in one or more integrated circuits. The various components in the mobile device 100 can be coupled by one or more communication buses or signal lines.

Sensors, devices, and subsystems can be coupled to the peripherals interface 506 to facilitate multiple functionalities. For example, a motion sensor 510, a light sensor 512, and a proximity sensor 514 can be coupled to the peripherals interface 506 to facilitate the orientation, lighting, and proximity functions described with respect to FIG. 1. Other sensors 516 can also be connected to the peripherals interface 506, such as a positioning system (e.g., GPS receiver), a temperature sensor, a biometric sensor, or other sensing device, to facilitate related functionalities.

A camera subsystem 520 and an optical sensor 522, e.g., a charged coupled device (CCD) or a complementary metal-oxide semiconductor (CMOS) optical sensor, can be utilized to facilitate camera functions, such as recording photographs and video clips.

Communication functions can be facilitated through one or more wireless communication subsystems 524, which can include radio frequency receivers and transmitters and/or optical (e.g., infrared) receivers and transmitters. The specific design and implementation of the communication subsystem 524 can depend on the communication network(s) over which the mobile device 100 is intended to operate. For example, a mobile device 100 may include communication subsystems 524 designed to operate over a GSM network, a GPRS network, an EDGE network, a Wi-Fi or WiMax network, and a Bluetooth™ network. In particular, the wireless communication subsystems 524 may include hosting protocols such that the device 100 may be configured as a base station for other wireless devices.

An audio subsystem 526 can be coupled to a speaker 528 and a microphone 530 to facilitate voice-enabled functions, such as voice recognition, voice replication, digital recording, and telephony functions.

The I/O subsystem 540 can include a touch screen controller 542 and/or other input controller(s) 544. The touch-screen controller 542 can be coupled to a touch screen 546. The touch screen 546 and touch screen controller 542 can, for example, detect contact and movement or break thereof using any of a plurality of touch sensitivity technologies, including but not limited to capacitive, resistive, infrared, and surface acoustic wave technologies, as well as other proximity sensor arrays or other elements for determining one or more points of contact with the touch screen 546.

The other input controller(s) 544 can be coupled to other input/control devices 548, such as one or more buttons, rocker switches, thumb-wheel, infrared port, USB port, and/or a pointer device such as a stylus. The one or more buttons (not shown) can include an up/down button for volume control of the speaker 528 and/or the microphone 530.

In one implementation, a pressing of the button for a first duration may disengage a lock of the touch screen 546; and a pressing of the button for a second duration that is longer than the first duration may turn power to the mobile device 100 on or off. The user may be able to customize a functionality of one or more of the buttons. The touch screen 546 can, for example, also be used to implement virtual or soft buttons and/or a keyboard.

In some implementations, the mobile device 100 can present recorded audio and/or video files, such as MP3, AAC, and MPEG files. In some implementations, the mobile device 100 can include the functionality of an MP3 player, such as an iPod Touch™.

The memory interface 502 can be coupled to memory 550. The memory 550 can include high-speed random access memory and/or non-volatile memory, such as one or more magnetic disk storage devices, one or more optical storage devices, and/or flash memory (e.g., NAND, NOR). The memory 550 can store an operating system 552, such as Darwin, RTXC, LINUX, UNIX, OS X, WINDOWS, or an embedded operating system such as VxWorks. The operating system 552 may include instructions for handling basic system services and for performing hardware dependent tasks. In some implementations, the operating system 552 can be a kernel (e.g., UNIX kernel).

The memory 550 may also store communication instructions 554 to facilitate communicating with one or more additional devices, one or more computers and/or one or more servers. The memory 550 may include graphical user interface instructions 556 to facilitate graphic user interface processing; sensor processing instructions 558 to facilitate sensor-related processing and functions; phone instructions 560 to facilitate phone-related processes and functions; electronic messaging instructions 562 to facilitate electronic-messaging related processes and functions; web browsing instructions 564 to facilitate web browsing-related processes and functions; media processing instructions 566 to facilitate media processing-related processes and functions; GPS/Navigation instructions 568 to facilitate GPS and navigation-related processes and instructions; camera instructions 570 to facilitate camera-related processes and functions; and/or other software instructions 572 to facilitate other processes and functions, e.g., security processes and functions. In some implementations, the GUI instructions 556 and/or the media processing instructions 566 implement the features and operations described in reference to FIGS. 1-4.

The memory 550 may also store other software instructions (not shown), such as web video instructions to facilitate web video-related processes and functions; and/or web shopping instructions to facilitate web shopping-related processes and functions. In some implementations, the media processing instructions 566 are divided into audio processing instructions and video processing instructions to facilitate audio processing-related processes and functions and video processing-related processes and functions, respectively. An activation record and International Mobile Equipment Identity (IMEI) 574 or similar hardware identifier can also be stored in memory 550.

Each of the above identified instructions and applications can correspond to a set of instructions for performing one or more functions described above. These instructions need not be implemented as separate software programs, procedures, or modules. The memory 550 can include additional instructions or fewer instructions. Furthermore, various functions of the mobile device 100 may be implemented in hardware and/or in software, including in one or more signal processing and/or application specific integrated circuits.

It should be appreciated that while the implementations described above are described in reference to a mobile device, the described implementations can be implemented on any device, mobile or not, that can sample ambient noise (e.g., a television, computer).

While this specification contains many specifics, these should not be construed as limitations on the scope of what being claims or of what may be claimed, but rather as descriptions of features specific to particular embodiments. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understand as requiring that such operations be performed in the particular order shown or in sequential order, or that all illustrated operations be performed, to achieve desirable results. In certain circumstances, multitasking and parallel processing may be advantageous. Moreover, the separation of various system components in the embodiments described above should not be understood as requiring such separation in all embodiments, and it should be understood that the described program components and systems can generally be integrated together in a single software product or packaged into multiple software products.

Thus, particular embodiments have been described. Other embodiments are within the scope of the following claims.

What is claimed is:

1. A method performed by a mobile device comprising:
    playing audio content by the mobile device;
    sampling ambient noise by the mobile device from a local environment of the mobile device to obtain a sample of the ambient noise, the ambient noise interfering with the played audio content;
    converting the sampled ambient noise to an audio fingerprint;
    comparing the audio fingerprint to other ambient noise audio fingerprints previously stored at the mobile device, each stored ambient noise audio fingerprint previously created by the mobile device by:
        sampling a respective ambient noise by the mobile device from a respective local environment while playing audio content, and
        converting the respective ambient noise to the each stored ambient noise audio fingerprint;
    when a match is identified, retrieving an action item from a table of actions associated with the stored ambient noise audio fingerprints; and
    performing a function of a graphical user interface control of the mobile device as determined by the action item.

2. The method of claim 1, wherein the performed function comprises:
    overlaying a partially transparent sheet on the graphical user interface, the sheet including one or more options associated with the currently playing audio content.

3. The method of claim 2, further comprising:
    overlaying one or more controls on the graphical user interface which are operable through touch input to control the audio content.

4. The method of claim 1, wherein the performed function comprises:
    displaying subtitles associated with the currently playing audio content on the graphical user interface.

5. The method of claim 1, wherein the performed function comprises:
    displaying closed captions associated with the currently playing audio content.

6. The method of claim 1, wherein the performed function comprises:
    pausing the currently playing audio content.

7. The method of claim 1, wherein the performed function comprises:
    adjusting a volume level of the audio content.

8. The method of claim 1, wherein the performed function comprises:
    muting the audio content.

9. The method of claim 1, further comprising:
    obtaining input from one or more controls or sensors of the mobile device; and
    determining the altering to be performed on performing the function of the graphical user interface based on the sample and the input, where the function is related to the currently playing audio content.

10. A non-transitory computer-readable medium having instructions stored thereon, which, when executed by a processor, causes the processor to perform operations comprising:
    playing audio content by a mobile device;
    sampling ambient noise by the mobile device from a local environment of the mobile device to obtain a sample of the ambient noise, the ambient noise interfering with the audio content;
    converting the sample to an audio fingerprint;
    comparing the audio fingerprint to other ambient noise audio fingerprints previously stored at the mobile device, each stored ambient noise audio fingerprint previously created by the mobile device by:
        sampling a respective ambient noise by the mobile device from a respective local environment while playing audio content, and
        converting the respective ambient noise to the each stored ambient noise audio fingerprint;
    when a match is identified, retrieving an action item from a table of actions associated with the stored ambient noise audio fingerprints; and
    altering the playing of the audio content to play the audio content in an augmented format as determined by the action item.

11. The computer-readable medium of claim 10, wherein the augmented format comprises:
    overlaying a partially transparent sheet on the graphical user interface, the sheet including one or more options associated with the currently playing audio content.

12. The computer-readable medium method of claim 10, further comprising:
    overlaying one or more controls on the graphical user interface which are operable through touch input to control the content.

13. The computer-readable medium of claim 10, wherein the augmented format comprises:
    displaying subtitles associated with the currently playing audio content on the graphical user interface.

14. The computer-readable medium of claim 10, wherein the augmented format comprises:
   displaying closed captions associated with the currently playing audio content.

15. The computer-readable medium of claim 10, wherein the augmented format comprises:
   pausing the currently playing audio content.

16. The computer-readable medium of claim 10, wherein the augmented format comprises:
   adjusting a volume level of the audio content.

17. The computer-readable medium method of claim 10, wherein the augmented format comprises:
   muting the audio content.

18. The computer-readable medium of claim 10, where the operations further comprise:
   obtaining input from one or more controls or sensors of the mobile device; and
   determining the altering to be performed on the on the playing of the audio content based on the sample and the input.

19. A method performed by a mobile device comprising:
   playing audio content by the mobile device;
   estimating location of the mobile device during the playing via a global positioning system function of the mobile device;
   comparing the estimated location to other locations previously stored by the mobile device at which noise events were detected that interfered with other playing events, wherein the other locations were determined by the global positioning function of the mobile device;
   when the estimated location matches a previously stored location, retrieving an action item from a table of actions associated with the previously stored location and altering the playing of the audio content to play the audio content in an augmented format based on the action item.

20. The method of claim 19, wherein the augmented format comprises:
   overlaying a partially transparent sheet on a user interface of the mobile device, the sheet including one or more options associated with the currently playing audio content.

21. The method of claim 19, wherein the augmented format comprises:
   overlaying one or more controls on a user interface of the mobile device which are operable through touch input to control the audio content.

22. The method of claim 19, wherein the augmented format comprises:
   displaying subtitles associated with the currently playing audio content on a user interface of the mobile device.

23. The method of claim 19, wherein the augmented format comprises:
   displaying closed captions associated with the currently playing audio content.

24. The method of claim 19, wherein the augmented format comprises:
   pausing the currently playing audio content.

25. The method of claim 19, wherein the augmented format comprises:
   adjusting the volume level of the audio content.

26. The method of claim 19, wherein the augmented format comprises:
   muting the audio content.

* * * * *